United States Patent [19]

Takahashi et al.

[11] Patent Number: 4,677,252
[45] Date of Patent: Jun. 30, 1987

[54] CIRCUIT BOARD

[75] Inventors: Satoshi Takahashi; Akira Tsutsumi; Junji Suzuki; Hiroshi Kumakura, all of Tochigi; Takao Ito, Tokyo; Kenji Ohsawa, Kanagawa; Yuji Ikegami, Kanagawa; Muneyuki Haruki, Kanagawa; Nobuyuki Yasuda; Masayuki Ohta, both of Tokyo, all of Japan

[73] Assignee: Sony Corporation, Tokyo, Japan

[21] Appl. No.: 933,369

[22] Filed: Nov. 18, 1986

Related U.S. Application Data

[63] Continuation of Ser. No. 593,435, Mar. 26, 1984, abandoned.

[30] Foreign Application Priority Data

Mar. 26, 1983 [JP] Japan ................................. 58-50991

[51] Int. Cl.$^4$ ................................................ H05K 1/05
[52] U.S. Cl. ................................. 174/68.5; 361/398; 361/411
[58] Field of Search .............. 174/68.5; 361/388, 398, 361/411

[56] References Cited

U.S. PATENT DOCUMENTS

| Re. 39,784 | 9/1978 | Chadwick et al. | 174/68.5 |
| 3,259,805 | 7/1966 | Osipchak et al. | 361/388 |
| 3,296,099 | 1/1967 | Dinella | 174/68.5 X |
| 3,354,542 | 11/1967 | Mallia | 361/388 X |
| 3,932,689 | 1/1976 | Watanabe et al. | 174/68.5 X |
| 3,934,334 | 1/1976 | Hanni | 361/411 X |
| 4,212,912 | 7/1980 | Wartusch et al. | 174/68.5 X |

FOREIGN PATENT DOCUMENTS

| 2257232 | 5/1973 | Fed. Rep. of Germany | 361/398 |
| 2741417 | 3/1978 | Fed. Rep. of Germany | 174/68.5 |

Primary Examiner—R. R. Kucia
Attorney, Agent, or Firm—Hill, Van Santen, Steadman & Simpson

[57] ABSTRACT

A circuit board comprises a rigid metal substrate, a conductive metal layer formed into a predetermined circuit pattern, and a resinous layer interposed between the metal substrate and the metal layer for electrically insulating and bonding the metal substrate and the metal layer, the conductive metal layer having an elongation at break of not less than 15%, and the resinous layer comprising a first resinous layer having a volume resistivity of not less than $10^{10}\Omega$. cm, and a second resinous layer having an elongation at break of not less than 100%. The circuit board has a desired dielectric strength between the metal substrate and the conductive metal layer and can be bent without resulting disconnection in the metal layer or the like.

6 Claims, 8 Drawing Figures

CIRCUIT BOARD

This is a continuation of application Ser. No. 593,435, filed Mar. 26, 1984, now abandoned.

BACKGROUND OF THE INVENTION

1. Field of the Invention

This invention relates to a circuit board using an aluminum or like other metal plate as a substrate.

2. Description of the Prior Art

As the mounting density of components has become increased with the recent trend of reducing the size of various electronic equipments, circuit boards having a substrate made of a metal plate which can efficiently dissipate heat generated from these components and excellent in mechanical strength have now been used frequently. A circuit board of the above-mentioned type is constituted such that a conductive layer, for example, made of a copper foil having a predetermined pattern is layered on a metal plate, such as made of aluminum by way of a resinous layer having a good insulation property. However, upon applying bending work or the like to such a circuit board, since the resinous layer generally rigid in nature can not afford a sufficient elongation necessary for the bending, crackings or like other defects may possibly result in the resinous layer to reduce the dielectric strength in the bent portion, or disconnection may be caused to the conductive layer because the copper foil which is usually employed for the conductive layer has a poor elongation as low as about 10%. Thus, the circuit board of the foregoing structure has generally been used substantially in a flat state.

Consequently, it is impossible for an equipment of a complicated shape to effectively utilize the inner space, for instance, by enclsoing circuit boards therein while optionally bending them along the space and thereby rendering the size and the shape of the equipment compact, whereby the foregoing size-reducing demand for electronic equipment has not yet been satisfied completely.

In view of the above, some use has been made of soft resin materials for the resinous layer of the circuit board so as to overcome the foregoing troubles such as the crackings in the resinous layer or the disconnection of the conductive layer by the elongation of the resinous layer and thereby rendering the circuit board adaptible to the bending fabrication.

However, soft resin materials are generally poor in electrical insulating performance and, particularly, there have not been known any soft resin materials capable of maintaining sufficient dielectric strength after a moisture-proof test. It is thus difficult to obtain a circuit board having a predetermined dielectric strength and such a board has not been put to practical use.

OBJECT OF THE INVENTION

Accordingly it is an object of the present invention to provide a circuit board which can possess a predetermined dielectric strength between a metal substrate and a conductive layer, and which is bendable while causing no undesired defects such as disconnection in the conductive layer upon bending of the board.

SUMMARY OF THE INVENTION

As a result of study for overcoming the foregoing drawbacks in the prior art, the present inventors have found that a circuit board which has a predetermined dielectric strength between a metal substrate and a conductive metal layer and which is bendable can be obtained by bonding the conductive metal layer having a predetermined elongation to the metal substrate by way of a resinous layer excellent in electrical insulating performance and another resinous layer having a predetermined elongation laminated to each other.

Specifically, the above object can be attained by a bendable circuit board according to the present invention comprising a rigid metal substrate, a conductive metal layer formed into a predetermined circuit pattern, and a resinous layer interposed between the metal substrate and the metal layer for electrically insulating and bonding the metal substrate and the metal layer, the conductive metal layer having an elongation at break of not less than 15%, and the resinous layer comprising a first resinous layer having volume resistivity of not less than $10^{10} \Omega$. cm, (ohm. centimeter) and a second resinous layer having an elongation at break of not less than 100%.

BRIEF DESCRIPTION OF THE ACCOMPANYING DRAWINGS

These and other objects, as well as the advantageous features of the present invention will be made clearer by reading the following descriptions for the preferred embodiment of the present invention while referring to the accompanying drawings wherein.

DESCRIPTION OF THE PREFERRED EMBODIMENTS

Figure 1:
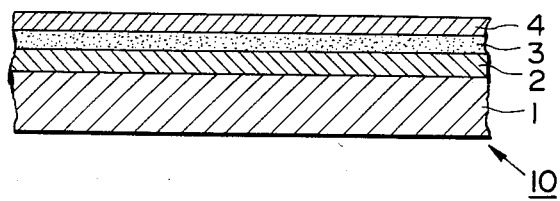
FIG. 1 is a cross-sectional view of a part of a circuit board as a preferred embodiment according to the present inventio.

Referring to FIG. 1, a circuit board 10 constituted according to the present invention comprises a metal substrate 1 and a second resin layer 2 having an elongation of greater than 100% and a first resin layer 3 having a predetermined volume resistivitiy each being laminated on the substrate 1, and a conductive metal layer 4 further layered over these resin layers 2 and 3 and formed into a predetermined wiring pattern through etching. The elongation mentioned herein means the ratio of an elongated length at break relative to an original length, expressed by percentage, of a material layer having predetermined thickness and width when the layer is subjected to tensile elongation.

The metal substrate 1 may be made of any kind of metal plates such as iron, aluminum, copper, bronze and stainless steel, as well as any of the above metal plates applied with surface treatment such as electrolytic plating or molten state plating.

The first resin layer 3 is made of resin material having a volume resistivity of not less than $10^{13} \Omega$.cm under the normal condition and a volume resistivity of not less than $10^{10}\Omega.cm$ after the wetproof test in which the layer is kept for 92 hours under the conditions of temperature at 40° C. and relative humidity of 90%. Such a resin material includes epoxy resin, polyester resin, polyimide resin, acrylic resin and modified resins thereof. A resin of this kind generally has an elongation of less than 5%.

The second resin layer 2 is made of a resin material having an elongation of greater than 100% and such a resin material includes polyamide resin, rubbery resin such an acrylic rubber, nitrile rubber and urethane rubber, acrylic adhesives and rubber adhesives.

The first and the second resin layers preferably have a thickness capable of maintaining the dielectric strength between the metal substrate and the conductive metal layer at higher than 2 KV (Kilovolts) and, preferably, higher than 5 KV. Specifically, it is preferred that the thickness for each of the layer is between 20–300μ(microns) and that the total thickness of the two layers is less than 500μ.

The conductive metal layer 4 is made of a metal foil such as copper, tin, nickel, aluminum and gold, as well as a metal layer formed with coating a paste of these mtals, sputtering, eposition or plating thereof. A metal layer provided with an elongation of greater than 15%, for instance, by annealing is preferably used.

In manufacturing the circuit board 10, the first resin layer 3 and the second resin layer 2 can be formed by an desired means, for instance, by coating a liquid resin material on the metal substrate 1 or the metal conductive layer 4, or by laminating resin materials previously fabricated into films through heat-bonding. Furthermore, activation treatment such as corona discharge, sand blast and solvent activation can be applied to the substrate, the conductive layer 4 and the boundary between each of the resin layers 2,3 for improving the bonding strength between each of the layers 1, 2, 3 and 4..

Figure 2:
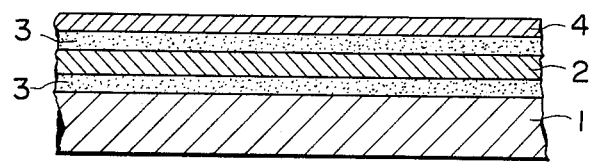
FIG. 2 through FIG. 5 are, respectively, cross-sectional views of a part of a circuit board in other preferred embodiments according to the present invention.
Figure 3:
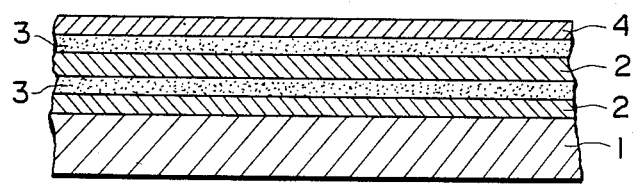

Further, the first resin layer 3 and the second resin layer 2 may be formed respectively in a plurality of layers as shown in FIG. 2 or FIG. 3 and the order of layering each of the layers 2,3 may be varied optionally.

Figure 4:
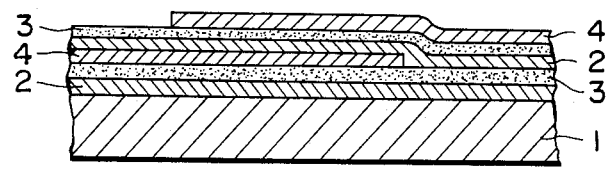
Figure 5:
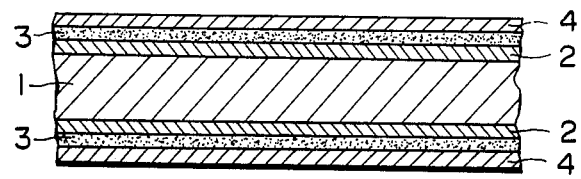

Furthermore, the conductive metal layer 4 may be disposed in a plurality of layers by way of the first resin layer 3 and the second resin layer into a so-called multi-layered circuit board 2 as shown, for instance, in FIG. 4 or into a dual face circuit board as shown in FIG. 5.

In FIGS. 2 through 5 illustrating each of the above-mentioned embodiments, structural elements similar to those of the circuit board 10 in FIG. 1 carry the same reference numerals respectively.

Since strains formed upon bending can be absorbed due to the elongation of the second resin layer 2 neither the cracking nor the disconnection results in the first resin layer 3 or the conductive metal layer 4, so the board can be bent into various configurations depending on the use.

Explanation will now be made of preferred embodiments of applying the circuit board 10 obtained according to the present invention.

Figure 6:
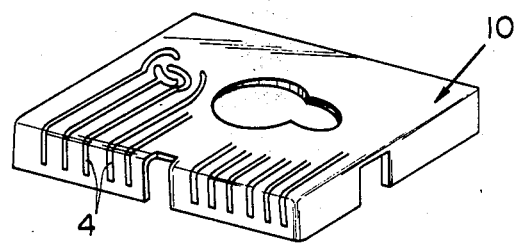
FIG. 6 is a schematic perspective view of an illustration of application use of the circuit board according to the present invention.

FIG. 6 shows the circuit board 10 according to this invention which is employed as for an equipment chassis in an application to a so-called circuit-integrated type chassis. Since the circuit board 10 having thus been formed with the metal substrate 1 has a sufficient mechanical strength, it can be used as the chassis for an equipment, whereby the space in which a circuit wiring pattern is formed can be extended.

Figure 7:
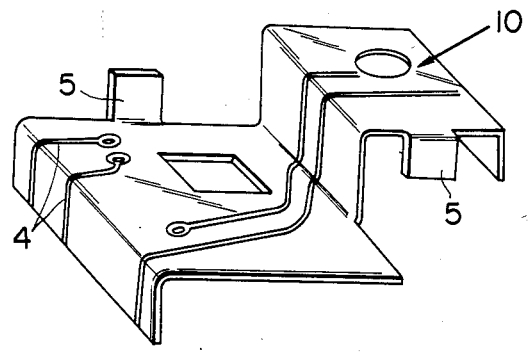
FIG. 7 is a schematic perspective view of a further application use of the circuit board according to the present invention.

FIG. 7 shows the application of the circuit board 10 to a heat sink chassis. In this case, generated heat can efficiently be dissipated by forming a heat sink palte 5 at a portion where the heat generation is extensive in view of the circuit structure. In addition, the space in the equipment of a complicate configuration can effectively be utilized by optionally bending the circuit board 10.

Figure 8:
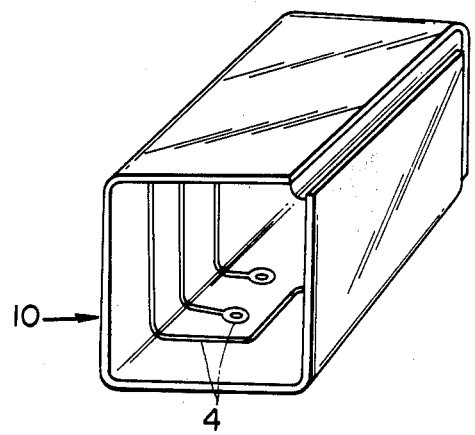
FIG. 8 is a schematic perspective view of a still further application use of the circuit board according to the present invention.

FIG. 8 shows the application of the circuit board 10 to a shield case. In this case, the circuit board 10 is bent into a box-like configuration, whereby electrostatic shielding can be attained with no particular components for high frequency circuits or the like formed on the circuit board 10.

As described above, since the circuit board 10 according to this invention has an excellent dielectric strength and can be subjected to bending fabrication, it can be used while being bent into various shapes depending on the purpose of use, thereby enabling effective utilization of the space within an equipment or effective utilization of heat dissipating effect or shielding effect of the substrate.

Specific examples of the present invention will now be described below.

(RESIN SOLUTION PREPARATION EXAMPLE 1)

80 parts by weight of phenoxy resin (PKHH, manufactured by Union Carbide Corp.), 20 parts by weight of epoxy resin (1001, manufactured by Shell Chemical Co.) and 0.5 parts by weight of undeciimidazole as a hardening agent were dissolved into methyl ethyl ketone to prepare 30% by weight of a resin solution. The resin solution thus prepared is hereinafter referred to as a resin solution A.

The resin solution A was coated on a polyester film previously applied with releasing treatment and cured at 150° C. for 30 min to obtain a film of 20μ thickness. When the film was cut into a size of 10 mm width and 100 mm length and subjected to tensile test at a tensile speed of 50 mm/min, for the measurement of elongation, the elongation at break was 3%. The film has a volume resistivity of $10^{14}\Omega.cm$ under the normal condition and $10^{13}\Omega.cm$ after the wet proof test for 92 hours under the conditions of temperature at 40° C. and relative humidity 90%.

(RESIN SOLUTION PREPARATION EXAMPLE 2)

10 parts by weight of acrylic rubber (#5002, manufactured by Teikoku Kagaku Co.), 20 parts by weight of epoxy resin (1001, manufactured by shell Chemical Co.) and 0.15 parts by weight of undeciimidazole as a hardening agent were dissolved into 50 parts by weight of methyl ethyl ketone and 20 parts by weight of toluene to prepare a resin soltuion B. The resin solution is hereinafter referred to as a resin solution B.

The resin solution B was coated on a polyester film previously applied with releasing treatment and cured at 150° C. for 30 min to obtain a film of 20μ thickness. When the film was cut into a size of 10 mm width and 100 mm length and subjected to tensile test at a tensile speed of 50 mm/min, for the measurement of elongation, the elongation at break was 180%. The film had a volume resistivity of $10^{13}\Omega.cm$ under the normal condition and $10^9\Omega.cm$ after the wet proof test.

(RESIN SOLUTION PREPARATION EXAMPLE 3)

80 parts by weight of butyl acrylate, 15 parts by weight of ethyl acrylate and 5 parts by weight of acrylic acid was incorporated with 1.0 parts by weight of benzoyl peroxide and they were polymerized in ethyl acetate to obtain a solution with a solid content of 25% by weight and a viscosity of 8000 cps (centipoises). To 100 parts by weight of the solution, were added 2.5 parts by weight of terpene phenol resin (S-145, manufactured by Yasuhara Jushi Co.) and 0.25 parts by weight of butylated melamine (J-820, manufactured by Reichfold Co.) to obtain a resin solution. The resin solution is hereinafter referred to as a resin solution C.

When measuring the elongation of the film prepared from the resin solution C, the elongation at break was more than 300%. The film has a volume resistivity of $10^{13} \Omega \cdot cm$ under the normal condition and $10^8 \Omega \cdot cm$ after the wet proof test.

(PREPARATION EXAMPLE FOR COMPARATIVE RESIN SOLUTION)

5 parts by weight of acrylic rubber (#5002, manufactured by Teikoku Kagaku Co.), 25 parts by weight of epoxy resin (1001, manufactured by Shell Chemical Co.) and 0.15 parts by weight of undeciimidazole as a hardening agent were dissolved into 50 parts by weight of methyl ethyl ketone and 20 parts by weight of toluene to prepare a resin solution. The resin solution is hereinafter referred to as a comparative resin solution.

When the elongation of the film prepared from the comparative resin solution was measured, the elongation at break was 80%.

(COPPER FOIL PREPARATION EXAMPLE 1)

An electrolyte copper foil of $35\mu$ thickness (3% elongation) was annealed. The copper foil thus obtained was left in an oven at 180° C. for 3 hours, cooled and then, cut into a size of 3 mm width and 100 mm length. When the elongation was measured at the tensile speed of 50 mm/min, the elongation was 16%. Hereinafter, the copper foil is referred to as a copper foil A.

(COPPER FOIL PREPARATION EXAMPLE 2)

A rolled copper fil of $35\mu$ thickness (1.8% elongation) was annealed and the elongation of the thus obtained copper foil was measured to be 21%. The copper foil is hereinafter referred to as a copper foil B.

(EXAMPLE 1)

The resin solution A was coated and dried over the copper foil B so that the coating thickness after the drying was $20\mu$ and, further, the resin solution B was coated thereover and dried so that the coating thickness thereof after the drying was $20\mu$.

The resin solution A was coated and drived over an aluminum plate of 1 mm thickness as the substrate so that the coating thickness after the drying was $5\mu$. Then, the copper foil B coated with the resin solution A and the resin solution B was bonded to the aluminum plate and pressed at a pressure of 50 kg/cm² and cured at 150° C. for 3 hours to obtain a circuit board.

The copper foild B on the circuit board was applied with etching to form a plurality of copper foil patterns in a parallel band-like manner with the pattern width of 0.5 mm and the inter-pattern pitch of 0.5 mm.

The thus obtained circuit board was bent at around an iron rod of 1.5 mm diameter as a bending axis by the andle of 90 degrees in the direction substantially perpendicular to the copper foil pattern. Then, when each of the copper foil patterns was checked as to disconnection, it was confirmed that all of the copper foil patterns evidenced no disconnection. Further, when the dielectric strength between the copper foil patterns and the aluminum plate as the substrate was measured, it was more than DC 5 KV and further it was confirmed that no crackings resulted in the resin layer.

(EXAMPLE 2)

The resin solution A was coated and dried over the copper foil B so that coating thickness after the drying was $20\mu$, and the resin solution B was further coated thereover and dried so that the coating thickness after the drying was $20\mu$. The copper foil B coated with the resin solution A and the resin solution B was bonded with an aluminum plate of 1 mm thickness and pressed at a pressure of 50 kg/cm² and at a temperature of 150° C. for 3 hours to obtain a circuit board.

Etching was applied to the copper foil B on the circuit board thus obtained to form a copper foil pattern of 0.5 mm width. When the board was bent by the angle of 90 degrees in the same manner as in Example 1, neither a disconnection in the copper foil pattern nor the cracking in the resin layer was recognized and the dielectric strength between the copper foil pattern and the aluminum plate was more than 5 KV.

(EXAMPLE 3)

The resin solution A was coated and dried over the copper foil B so that the coating thickness after the drying was $20\mu$ and the resin solution C was further coated thereover and dried so that the coating thickness after the drying was $20\mu$.

While on the other hand, the resin layer A was coated and dried over an aluminum plate of 0.5 mm thickness so that the coating thickness after the drying was $5\mu$. Then, the copper foil B coated with the resin solution A and the resin solution C was bonded to the aluminum plate and pressed at a pressure of 50 kg/cm² and hardened at 150° C. for 3 hours to obtain a circuit board.

Etching was applied to the copper foil B on the circuit board thus obtained to form a plurality of copper foil patterns in a parallel band-like manner with the pattern width of 0.5 mm and the inner-pattern pitch of 0.5 mm.

When the board was bent by the bending angle of 180° and with a radius of curvature of 1.5 mm in the direction approximately perpendicular to the copper foil pattern, neither disconnection in the copper foil pattern nor the cracking in the resin layer was recognized, and the dielectric strength between the copper foil patterns and the aluminum plate was more than 5 KV.

(EXAMPLE 4)

The circuit board was manufactured in the same manner as in the previous Example 1 by using a copper foil A instead of the copper foil B. When the bending test was applied, neither a disconnection in the copper foil pattern nor the cracking in the resin layer was recognized.

(COMPARATIVE EXAMPLE 1)

The circuit board was manufactured in the same manner as in the previous Example 1 by using a non-annealed electrolytic copper foild (elongation 3%) instead of the copper foil B and also using the comparative resin solution instead of the resin solution B. When the bending test was applied, disconnection in the copper foil pattern and the cracking in the resin layer resulted.

(COMPARATIVE EXAMPLE 2)

The circuit board was manufactured in the same manner as in the previous Example 1 by using the comparative resin solution instead of the resin solution B. When the bending test was applied, disconnection in the copper foil pattern and the cracking in the resin layer resulted.

(COMPARATIVE EXAMPLE 3)

The circuit board was manufactured in the same manner as in the previous Example 3 by using a rolled copper foil processed with a reduced annealing time (elongation 13%) instead of the copper foil B. When the bending test was applied, although no cracking resulted in the resin layer disconnection was caused to the copper foil patterns.

As apparent from the description for each of the foregoing examples, it is possible according to this invention to provide a circuit board which has a predetermined dielectric strength between a metal substrate and a conductive layer and which can be bent while causing no disconnection or the like in the conductive layer upon bending.

What is claimed is:

1. A bendable laminated circuit board comprising a metal substrate which is bendable into a self-sustaining shape, a conductive metal layer formed into a predetermined circuit pattern, and a resinous layer interposed between said metal substrate and said metla layer for electrically insulating and bonding said metal substrate and siad metal layer, said conductive metal layer having an elongation at break of not less than 15%, and said resinous layer comprising a first resinous layer having a volume resistivity of not less than $10^{10} \Omega \cdot cm$, and a second resinour layer immediately adjacent said first layer and having an elongation at break of not less than 100%, said first layer having an elongation at break very substantially less than that of said second layer, said two resinous layers providing said circuit board with an improved resistance to cracking upon bending of the laminated board while maintaining the dielectric strength between said metal substrate and said conductive metal layer higher than 2 KV.

2. The circuit board according to claim 1, wherein the thickness for each of said first and second resinous layers is between 20 and $300\mu$ while the total thickness for said two layers is less than $500\mu$.

3. The circuit board according to claim 1, wherein said volume resistivity of said first resinous layer remains at least at the stated value after exposing said layer at 40° C. to an atmosphere of 90% relative humidity for 92 hours.

4. The circuit board according to claim 1, wherein said board is bent to have said conductive metal layer on the outer surface of the board.

5. The circuit board according to claim 1, wherein conductive metal layers are formed on both sides of said substrate.

6. The circuit board accoridng to claim 1, wherein said conductive metal layer is made of copper foil.

* * * * *